US006881634B2

(12) United States Patent
Watt

(10) Patent No.: US 6,881,634 B2
(45) Date of Patent: Apr. 19, 2005

(54) BURIED-CHANNEL TRANSISTOR WITH REDUCED LEAKAGE CURRENT

(75) Inventor: Jeffrey T. Watt, Palo Alto, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/232,586

(22) Filed: Aug. 30, 2002

(65) Prior Publication Data

US 2004/0043571 A1 Mar. 4, 2004

(51) Int. Cl.[7] .................. H01L 21/336; H01L 21/8238
(52) U.S. Cl. .................. 438/289; 438/217; 438/291; 438/218; 438/228
(58) Field of Search .................. 438/217, 289, 438/291, 302, 303, 515, 199, 228, 231, 232, 224, 532

(56) References Cited

U.S. PATENT DOCUMENTS

| 4,906,584 | A | * | 3/1990 | Blouke et al. ............... 438/146 |
| 5,489,794 | A | * | 2/1996 | Nonaka et al. ............... 257/369 |
| 5,795,803 | A | * | 8/1998 | Takamura et al. ............ 438/228 |
| 6,187,643 | B1 | * | 2/2001 | Borland ....................... 438/302 |
| 6,251,718 | B1 | * | 6/2001 | Akamatsu et al. ........... 438/217 |
| 6,294,416 | B1 | * | 9/2001 | Wu .............................. 438/199 |
| 6,297,082 | B1 | * | 10/2001 | Lin et al. ..................... 438/217 |
| 6,448,121 | B1 | * | 9/2002 | Brighton ...................... 438/197 |
| 6,514,810 | B1 | * | 2/2003 | Kim et al. .................... 438/232 |
| 6,548,359 | B1 | * | 4/2003 | Houston et al. .............. 438/289 |

* cited by examiner

Primary Examiner—John F. Niebling
Assistant Examiner—Ron Pompey
(74) Attorney, Agent, or Firm—Okamoto & Benedicto LLP

(57) ABSTRACT

In one embodiment, a buried-channel transistor is fabricated by masking a portion of an active region adjacent to a trench and implanting a dopant in an exposed portion of the active region to adjust a threshold voltage of the transistor. By masking a portion of the active region, the dopant is substantially prevented from getting in a region near an edge of the trench. Among other advantages, this results in reduced leakage current.

14 Claims, 6 Drawing Sheets

US 6,881,634 B2

BURIED-CHANNEL TRANSISTOR WITH REDUCED LEAKAGE CURRENT

BACKGROUND OF THE INVENTION

1. Field of the Invention

The present invention relates generally to integrated circuits, and more particularly to integrated circuit fabrication processes and structures.

2. Description of the Background Art

Integrated circuits fabricated using complementary metal oxide semiconductor (CMOS) technology have traditionally employed a single N+ doped polysilicon gate material for both N-channel metal oxide semiconductor (NMOS) and P-channel metal oxide semiconductor (PMOS) transistors. Due to the work function of N+ polysilicon, this results in a surface-channel NMOS transistor and a buried-channel PMOS transistor. The surface-channel NMOS transistor typically has good short-channel characteristics and can be scaled to gate dimensions of 0.1 µm and below. The buried-channel PMOS transistor typically has poor short-channel characteristics and, as a result, is designed with a larger threshold voltage than the surface-channel NMOS transistor to limit sub-threshold leakage current. Thus, the threshold voltage of a PMOS transistor is typically about 0.2 V larger than the threshold voltage of an NMOS transistor of the same gate length in order to produce the same off-state leakage current. For integrated circuits using supply voltages of 3.3 V or higher, the larger threshold voltage of the buried-channel PMOS is generally not a problem and good performance can be achieved. However, as the supply voltage scales below 3.3 V, the higher threshold voltage starts to have a significant effect on performance.

To improve PMOS transistor performance, a so-called "dual gate" approach may be used to fabricate CMOS integrated circuits requiring supply voltages of 2.5 V and below. The dual gate approach involves the use of N+ doped polysilicon gate for the NMOS transistor and P+ doped polysilicon gate for the PMOS transistor. The use of P+ polysilicon produces a surface-channel PMOS transistor that improves short-channel characteristics and enables the threshold voltage of the PMOS transistor to be reduced to about the same value as the NMOS transistor. Unfortunately, the dual gate approach is not feasible in some applications. For example, the dual gate approach is not typically implemented in CMOS memory applications due to constraints imposed by the memory cell architecture and requirements. As a result, many memory applications have continued to use a single N+ doped polysilicon gate material for both NMOS and PMOS transistors even as power supply voltages have scaled down to 1.8 V.

From the foregoing, a technique for improving the performance of buried-channel transistors is highly desirable.

SUMMARY

In one embodiment, a buried-channel transistor is fabricated by masking a portion of an active region adjacent to a trench and implanting a dopant in an exposed portion of the active region to adjust a threshold voltage of the transistor. By masking a portion of the active region, the dopant is substantially prevented from getting in a region near an edge of the trench. Among other advantages, this results in reduced leakage current.

These and other features of the present invention will be readily apparent to persons of ordinary skill in the art upon reading the entirety of this disclosure, which includes the accompanying drawings and claims.

The use of the same reference label in different drawings indicates the same or like components. Drawings are not necessarily to scale unless otherwise noted.

DETAILED DESCRIPTION

In the present disclosure, numerous specific details are provided such as examples of materials, process steps, and structures to provide a thorough understanding of embodiments of the invention. Persons of ordinary skill in the art will recognize, however, that the invention can be practiced without one or more of the specific details. In other instances, well known details are not shown or described to avoid obscuring aspects of the invention.

The present invention relates to buried-channel transistors. Although the present invention will be described using a trench-isolated buried-channel PMOS transistor as an example, it should be noted that embodiments of the present invention may be employed in the fabrication of buried-channel transistors in general.

Figure 1:
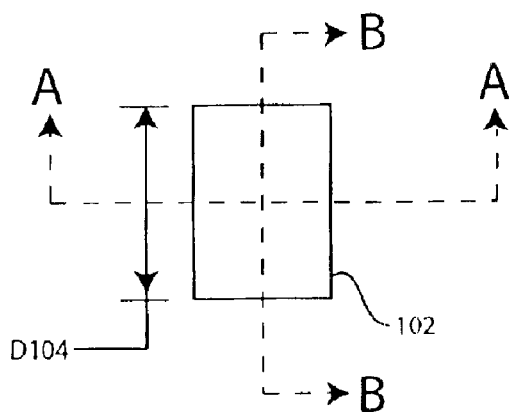
FIG. 1 schematically shows a top view of a section of a substrate.

FIG. 1 schematically shows a top view of a section of a substrate, which may comprise homogenous silicon, epitaxial silicon, or silicon on insulator (SOI). In FIG. 1, an active region 102 defines an area of the substrate where a transistor (e.g., transistor 550 shown in FIG. 5) will be formed. Dimension D104 represents the width of active region 102. Active region 102 may be surrounded by shallow trench isolation structures to separate the subsequently formed transistor in active region 102 from other transistors.

Figure 2A:
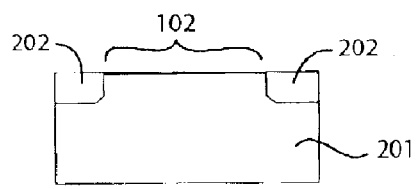
FIGS. 2A and 2B schematically show side cross-sectional views of the substrate of FIG. 1.
Figure 2B:
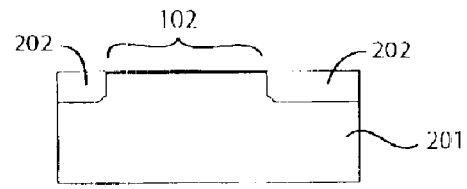

FIG. 2, which consists of FIGS. 2A and 2B, schematically shows side cross-sectional views of the substrate of FIG. 1. FIG. 2A schematically shows a side cross-sectional view taken at section A—A of FIG. 1, while FIG. 2B shows a side cross-sectional view taken at section B—B. In FIG. 2, the substrate is labeled as substrate 201. Trenches 202, which may be shallow trench isolation structures, may be conventionally formed in substrate 201. An implant screen oxide may be formed over active region 102 prior to subsequent implantation steps discussed below.

Figure 3A:
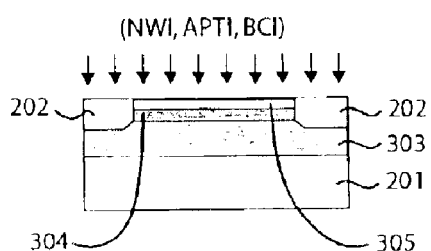
FIGS. 3A and 3B schematically show the sample of FIGS. 2A and 2B after implantation steps.
Figure 3B:
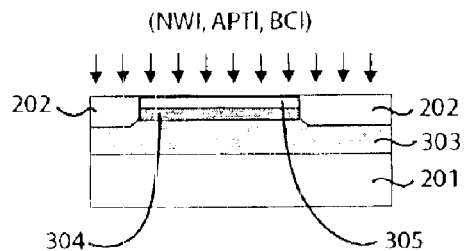

FIG. 3, which consists of FIGS. 3A and 3B, schematically shows the sample of FIG. 2 after an N-well implant (NWI), an anti-punchthrough implant (APTI), and a buried-channel implant (BCI). FIG. 3A is from the perspective of FIG. 2A, while FIG. 3B is from the perspective of FIG. 2B.

The N-well implant forms an N-well 303 and a transistor channel by implanting an N-type dopant, such as phosphorus or arsenic, in substrate 201. The N-well implant is performed at relatively high energy to form an N-well 303 with a depth typically between about 0.5 $\mu$m and 2.0 $\mu$m and concentration between about $2.0 \times 10^{16}$ cm$^{-3}$ and $2.0 \times 10^{18}$ cm$^{-3}$.

The anti-punchthrough implant forms an anti-punchthrough region 304 by implanting an N-type dopant, such as phosphorus, arsenic, or antimony, in substrate 201. The anti-punchthrough implant helps control punchthrough and short-channel effects. The anti-punchthrough implant results in an anti-punchthrough region 304 with a depth typically between about 0.1 $\mu$m and 0.4 $\mu$m and a peak concentration typically between about $2.0 \times 10^{16}$ cm$^{-3}$ and $2.0 \times 10^{18}$ cm$^{-3}$.

The buried-channel implant forms a buried-channel region 305 by implanting a P-type dopant, such as boron or indium, in substrate 201. For example, a P-type dopant may be implanted using boron difluoride as a precursor. The buried-channel implant is performed to adjust the threshold voltage of the transistor. The buried-channel implant results in a buried-channel region 305 with a depth typically between about 0.02 $\mu$m and 0.10 $\mu$m and a peak concentration typically between about $2.0 \times 10^{16}$ cm$^{-3}$ and $2.0 \times 10^{18}$ cm$^{-3}$.

Figure 4:
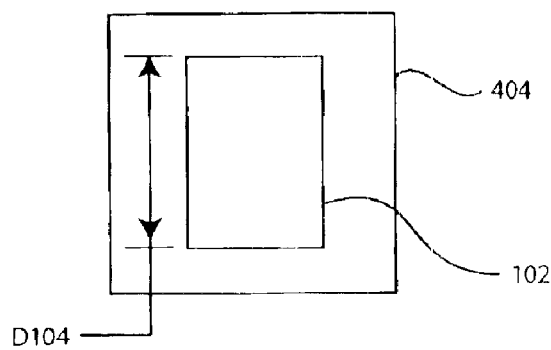
FIG. 4 schematically shows a top view of an implant mask.

FIG. 4 schematically shows a top view of an implant mask 404 over active region 102. In FIG. 4, the area inside the borders of mask 404 represents an opening in the mask. That is, mask 404 exposes active region 102 and surrounding regions. Mask 404, which may be a photoresist mask, is typically formed over substrate 201 as a mask for the N-well, anti-punchthrough, and buried-channel implants of FIG. 3. Thus, the just mentioned implants are performed in active region 102 and surrounding regions. Dimension D104 is shown in FIG. 4 for reference purposes. Mask 404 may be stripped after the N-well, anti-punchthrough, and buried-channel implants.

Figure 5:
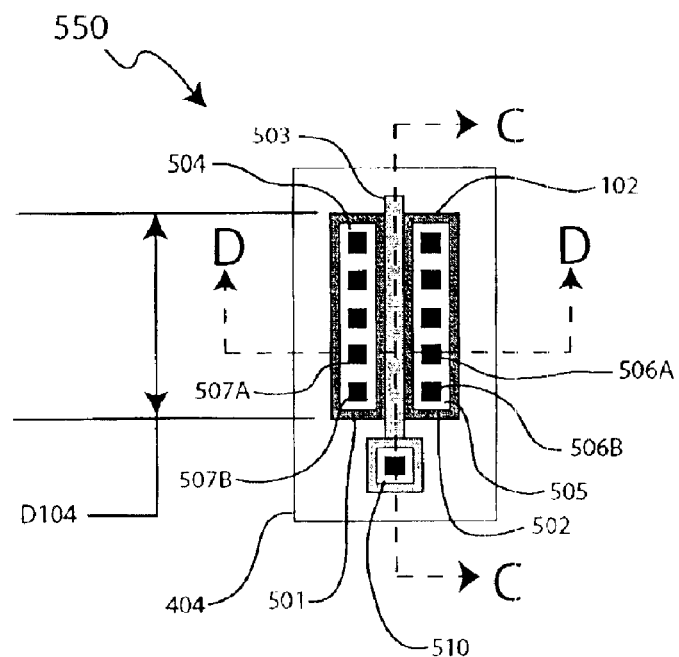
FIG. 5 schematically shows a top view of a transistor.
Figure 6A:
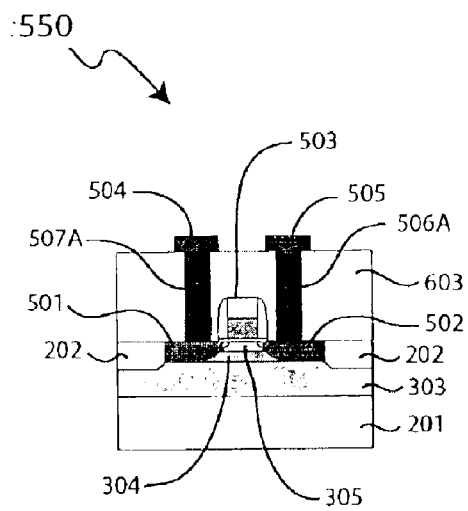
FIGS. 6A and 6B schematically show side cross-sectional views of the transistor of FIG. 5.
Figure 6B:
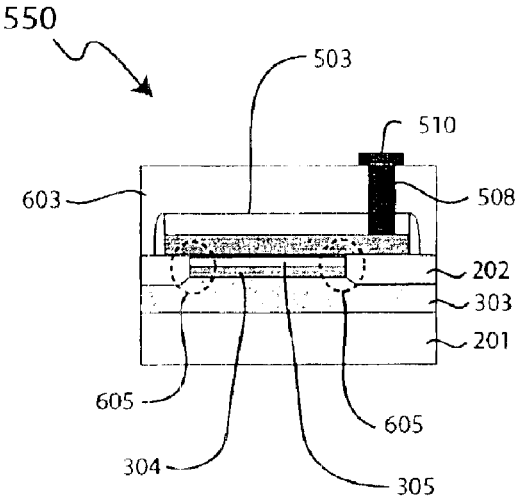

After the implant steps, a drain, a source, a gate, and associated transistor structures may then be conventionally formed in the sample of FIG. 3. FIG. 5 schematically shows a top view of a transistor 550 formed in active region 102. Dimension D104 and mask 404 are depicted in FIG. 5 for references purposes. FIG. 6, which consists of FIGS. 6A and 6B, schematically shows side cross-sectional views of transistor 550. FIG. 6A shows a side cross-sectional view of transistor 550 taken at section D—D of FIG. 5, while FIG. 6B shows a side cross-sectional view of transistor 550 taken at section C—C.

Referring to FIGS. 5 and 6, transistor 550 includes a source 501, a drain 502, and a gate 503. Not specifically labeled is the channel of transistor 550, which is a region under gate 503 and between source 501 and drain 502. In this example, transistor 550 is a trench-isolated buried-channel PMOS transistor. A complementary NMOS transistor is not shown for clarity of illustration.

Source 501 and drain 502 may be conventionally formed P-type regions with source and drain extensions, respectively. A metal 504 may be coupled to source 501 by one or more plugs 507 (i.e., 507A, 507B, . . . ). Similarly, a metal 505 may be coupled to drain 502 by one or more plugs 506 (i.e., 506A, 506B, . . . ). Not all of plugs 506 and 507 are labeled in FIG. 5 for clarity of illustration. As shown in FIG. 6B, a metal 510 may be coupled to gate 503 by a plug 508. Plugs 506, 507, and 508 may be of an electrically conductive material such as tungsten, for example. Plugs 506, 507, and 508 are in vias formed through a dielectric layer 603, which may be a layer of silicon dioxide.

Referring to FIG. 6B, the use of a mask 404 that exposes active region 102 and surrounding regions to the buried-channel implant results in buried-channel region 305 directly abutting edges of trenches 202. In the present disclosure, an edge of an isolation trench is also referred to as an "isolation edge". Dashed areas 605 show where buried-channel region 305 directly abuts edges of trenches 202. The inventor believes that parasitic transistor behavior may occur in dashed areas 605 because of a phenomena commonly known as "inverse narrow-width effect". Inverse narrow-width effect results in a lower threshold voltage for narrow transistors than for wide transistors. That is, inverse narrow-width effect may result in the lowering of the threshold voltage of transistor 550 as dimension D104 is reduced. As it relates to the present invention, the inventors believe that inverse narrow-width effect results in parasitic transistors in dashed areas 605, effectively having three transistors in active region 102. This results in parasitic leakage current along the edge of a trench 202. The parasitic leakage current, referred to as "isolation edge leakage current", can dominate the overall leakage current as the width of the channel of transistor 550 is reduced. Isolation edge leakage current is also a significant problem in low-leakage devices such as static random access memory (SRAM) devices.

One possible approach to the isolation edge leakage current problem is to increase the threshold voltage of all transistors in a device so that the leakage current of the narrowest transistor in the device is acceptable. However, this approach will degrade the performance of wide transistors in the device. Another possible approach to the isolation edge leakage current problem is to implant a dopant, such as an N-type dopant in the case of a PMOS transistor, into the sidewall of a trench before the trench is filled with oxide. Depending on the process employed by the device manufacturer, this approach may require at least three additional steps in the trench formation process namely, mask patterning, implant, and resist strip.

Figure 7:
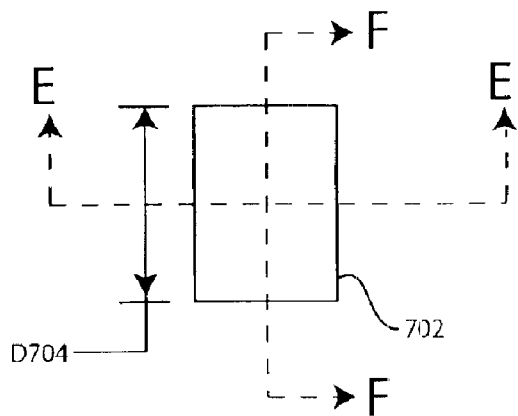
FIG. 7 schematically shows a top view of a section of a substrate where a transistor will be fabricated in accordance with an embodiment of the present invention.

FIGS. 7–14 schematically illustrate the fabrication of a buried-channel transistor in accordance with an embodiment of the present invention. Beginning in FIG. 7, there is schematically shown a top view of a section of a substrate, which is labeled as "substrate 801" in subsequent figures (e.g., see FIG. 8A). Substrate 801 may comprise homogenous silicon, epitaxial silicon, or silicon on insulator, for example. In FIG. 7, an active region 702 defines an area of substrate 801 where a transistor (e.g., transistor 1350 of FIG. 13) will be formed. Dimension D704 represents the width of active region 702, and thus is proportional to the width of the transistor channel formed therein. Active region 702 may be surrounded by shallow trench isolation structures to separate the subsequently formed transistor in active region 702 from other transistors.

Figure 8A:
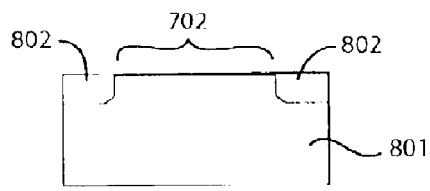
FIGS. 8A and 8B schematically show side cross-sectional views of the substrate of FIG. 7.
Figure 8B:
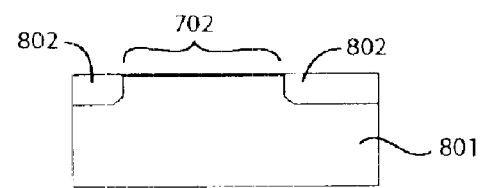

FIG. 8, which consists for FIGS. 8A and 8B, schematically shows side cross-sectional views of substrate 801. FIG. 8A schematically shows a side cross-sectional view taken at section E—E of FIG. 7, while FIG. 8B schematically shows a side cross-sectional view taken at section F—F. Trenches 802 may be shallow trench isolation structures conventionally formed in substrate 801, and may be filled with silicon dioxide. An implant screen oxide may be formed over active region 702 prior to subsequent implantation steps discussed below.

In the following discussion, well known steps that are not necessary to the understanding of the invention have been omitted for clarity of illustration. For example, as is well known, a thermal anneal step may be performed after an implant step to electrically activate implanted dopants. The thermal anneal step may be performed right after the implant, or at a later processing step. Additionally well known masking steps that are not necessary to the understanding of the invention are not described for clarity of illustration.

Figure 9A:
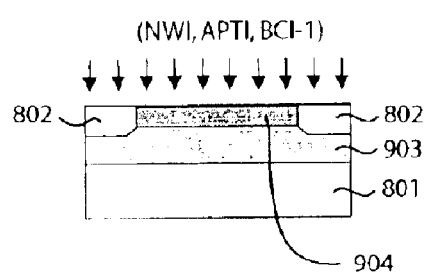
FIGS. 9A and 9B show the sample of FIGS. 8A and 8B after implantation steps in accordance with an embodiment of the present invention.
Figure 9B:
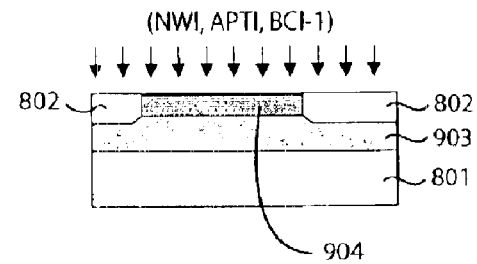

FIG. 9, which consists of FIGS. 9A and 9B, shows the sample of FIG. 8 after an N-well implant, an anti-punchthrough implant, and a first buried-channel implant (BCI-1). FIG. 9A is from the perspective of FIG. 8A, while FIG. 9B is from the perspective of FIG. 8B.

An N-well implant may be performed on the sample of FIG. 8 to form an N-well 903 and a transistor channel in substrate 801. Examples of N-type dopants that may be implanted in substrate 801 to form N-well 903 include phosphorous and arsenic. The N-well implant may be performed at relatively high energy to form an N-well 903 with a depth between about 0.5 $\mu$m and 2.0 $\mu$m and concentration between about $2.0 \times 10^{16}$ cm$^{-3}$ and $2.0 \times 10^{18}$ cm$^{-3}$.

An anti-punchthrough implant may be performed on the sample of FIG. 8 by implanting an N-type dopant, such as phosphorus, arsenic, or antimony, in substrate 801. The anti-punchthrough implant helps control punchthrough and short-channel effects. The anti-punchthrough implant results in an anti-punchthrough region 904 with a depth between about 0.1 $\mu$m and 0.4 $\mu$m and a peak concentration between about $2.0 \times 10^{16}$ cm$^{-3}$ and $2.0 \times 10^{18}$ cm$^{-3}$.

In accordance with an embodiment of the present invention, a buried-channel implant for adjusting the threshold voltage of a transistor may be split into two steps. A first buried-channel implant may be performed in substrate 801 using the same implant mask (e.g., mask 1014 of FIG. 10) as that used for the N-well and anti-punchthrough implants. After the first buried-channel implant, a second buried-channel implant may be performed using a different implant mask. The mask for the second buried-channel implant preferably blocks a region near an isolation edge (e.g., see mask 1214 of FIG. 12).

A first buried-channel implant may be performed by implanting a P-type dopant in substrate 801. Examples of P-type dopants that may be used in the first buried-channel implant include boron and indium. The first buried-channel implant may create a profile in the channel with a depth between about 0.02 $\mu$m and 0.10 $\mu$m and a peak concentration between about $2.0 \times 10^{16}$ cm$^{-3}$ and $2.0 \times 10^{18}$ cm$^{-3}$. The first buried-channel implant adjusts the threshold voltage of the transistor being formed in active region 702.

Figure 10:
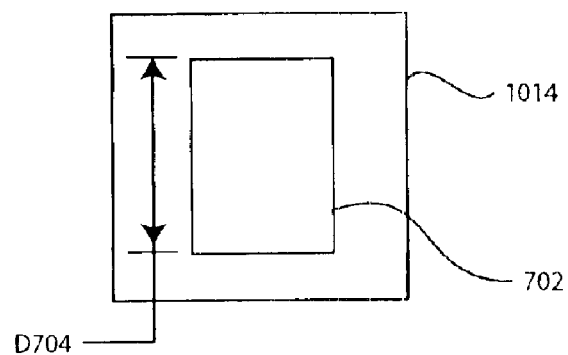
FIG. 10 schematically shows a top view of an implant mask in accordance with an embodiment of the present invention.

FIG. 10 schematically shows a top view of an implant mask 1014 over active region 702. In FIG. 10, the area inside the borders of mask 1014 represents an opening in the mask. Mask 1014 may be used as a mask for the N-well implant, anti-punchthrough implant, and first buried-channel implant of FIG. 9. Thus, the just mentioned implants are performed in active region 702 and surrounding regions. Dimension D704 is shown in FIG. 10 for reference purposes. Mask 1014, which may be a photoresist mask, may be stripped after the N-well implant, anti-punchthrough implant, and first buried-channel implant.

Figure 11A:
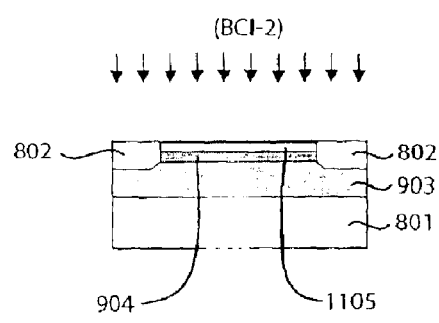
FIGS. 11A and 11B show side cross-sectional views of the sample of FIGS. 9A and 9B after a buried-channel implantation step in accordance with an embodiment of the present invention.
Figure 11B:
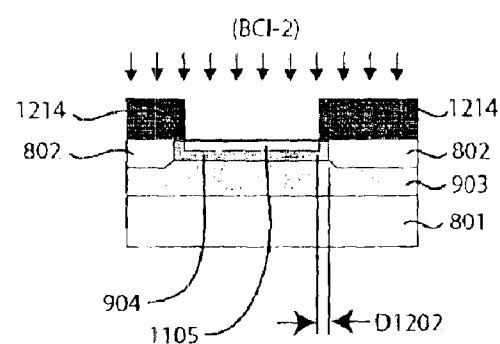

FIG. 11, which consists of FIGS. 11A and 11B, shows side cross-sectional views of the sample of FIG. 9 after a second buried-channel implant (BCI-2). FIG. 11A is from the perspective of FIG. 9A, while FIG. 11B is from the perspective of FIG. 9B. The second buried-channel implant may be performed by implanting a P-type dopant, such as boron or indium, in substrate 801 using an implant mask 1214. For example, a P-type dopant may be implanted using boron difluoride as a precursor. The second buried-channel implant further adjusts the threshold voltage of the transistor to be formed in active region 702. The second buried-channel implant results in a buriedchannel region 1105 with a depth between about 0.02 $\mu$m and 0.10 $\mu$m and a peak concentration between about $2.0 \times 10^{16}$ cm$^{-3}$ and $2.0 \times 10^{18}$ cm$^{-3}$.

Figure 12:
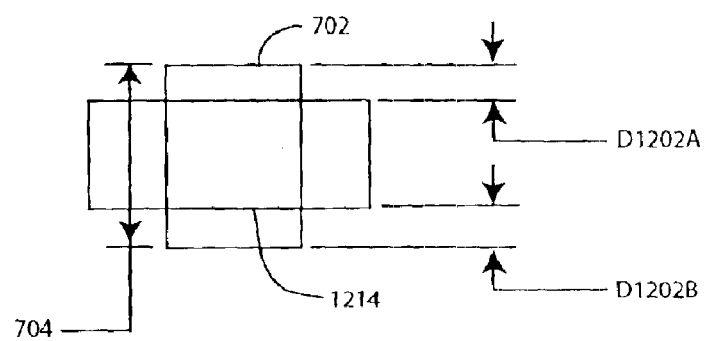
FIG. 12 schematically shows a top view of an implant mask in accordance with an embodiment of the present invention.

FIG. 12 schematically shows a top view of implant mask 1214 over active region 702. In FIG. 12, the area inside the borders of mask 1214 represents an opening in the mask. Mask 1214, which may be a photoresist mask, may be used as a mask for the second buried-channel implant of FIG. 11. Dimension D704 is shown in FIG. 12 for reference purposes. As can be appreciated, the design of mask 1214 should take into account the effects of misalignment, feature size variation of mask 1214 and a trench 802, lateral implant straggle, and lateral diffusion.

As shown in FIG. 11B and FIG. 12, mask 1214 blocks portions of active region 702 near an edge of a trench 802. This prevents the second buried-channel implant from getting into regions near an edge of a trench 802, thereby preventing the formation of a parasitic transistor near the isolation edge. As a result, isolation edge leakage current is reduced. As shown in FIG. 11B, the resulting buried-channel region 1105 after the second buried-channel implant does not directly abut an edge of a trench 802 along the length of active region 702.

As shown in FIG. 11A and FIG. 12, regions along the width of active region 702 (i.e., along dimension 704) do not necessarily have to be covered by mask 1214 to reduce isolation edge leakage current.

In FIG. 12, a dimension D1202 (i.e., D1202A or D1202B) represents the distance between an edge of an opening of mask 1214 and an edge of a trench 802. A dimension D1202 is also depicted in FIG. 11B. In one embodiment, a dimension D1202 is about 0.28 $\mu$m. A dimension D1202 may also be between about 0.1 $\mu$m and 0.5 $\mu$m. A dimension D1202 may also be varied to meet the needs of specific applications.

Mask 1214 may be stripped from the sample of FIG. 11 after the second buried-channel implant. Thereafter, a drain, a source, a gate, and associated transistor structures may be conventionally formed in the sample of FIG. 11.

Figure 13:
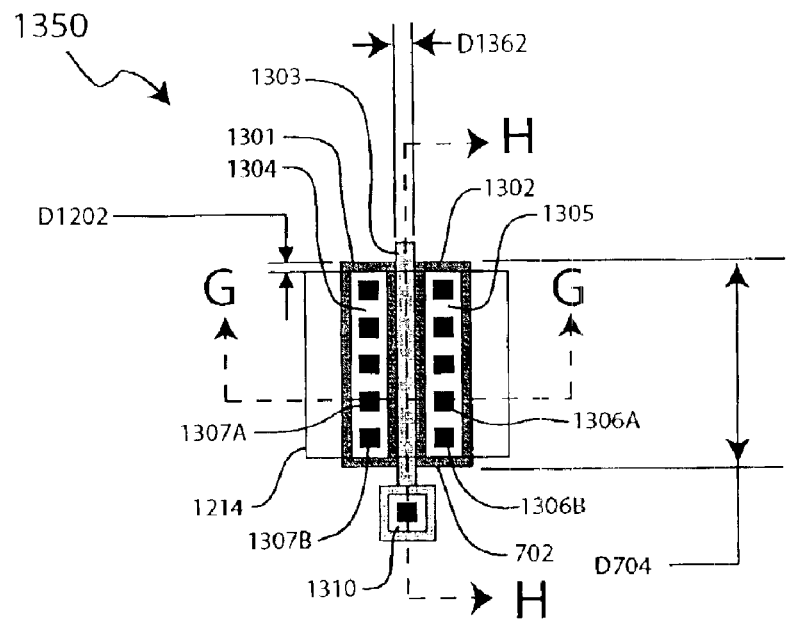
FIG. 13 schematically shows a top view of a transistor in accordance with an embodiment of the present invention.
Figure 14A:
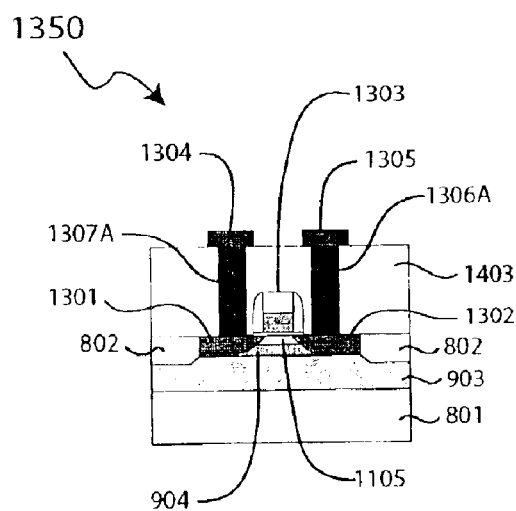
FIGS. 14A and 14B schematically show side cross-sectional views of the transistor of FIG. 13.
Figure 14B:
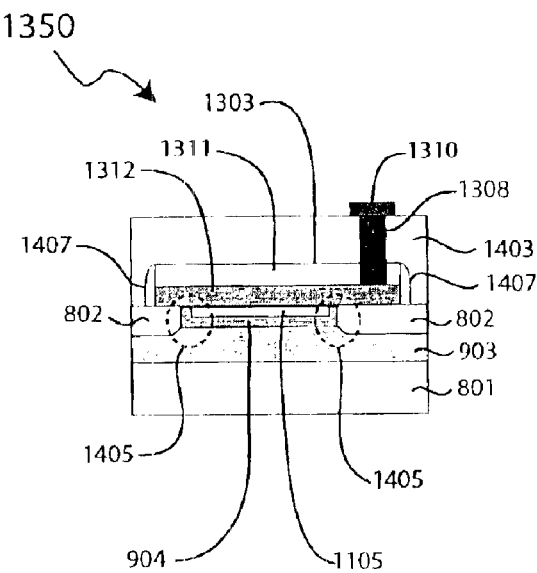

FIG. 13 schematically shows a top view of a transistor 1350 formed in active region 702 in accordance with an embodiment of the present invention. Dimension D704, a dimension D1202, and mask 1214 are depicted in FIG. 13 for reference purposes. FIG. 14, which consists of FIGS. 14A and 14B, schematically shows side cross-sectional views of transistor 1350. FIG. 14A shows a side cross-sectional view of transistor 1350 taken at section G—G of FIG. 13, while FIG. 14B shows a side cross-sectional view of transistor 1350 taken at section H—H.

Referring to FIGS. 13 and 14, transistor 1350 includes a source 1301, a drain 1302, and a gate 1303. Not specifically labeled is the channel of transistor 1350, which is a region under gate 1303 and between source 1301 and drain 1302. In this example, transistor 1350 is a trench-isolated buried-channel PMOS transistor. A complementary NMOS transistor, which may have been fabricated concurrently with transistor 1350 using conventional CMOS processing, is not shown for clarity of illustration.

Source 1301 and drain 1302 may be conventionally formed P-type regions with source and drain extensions, respectively. A metal 1304 may be coupled to source 1301 by one or more plugs 1307 (i.e., 1307A, 1307B, . . . ). Similarly, a metal 1305 may be coupled to drain 1302 by one or more plugs 1306 (i.e., 1306A, 1306B, . . . ). Not all of plugs 1306 and 1307 are labeled in FIG. 13 for clarity of illustration. As shown in FIG. 14B, a metal 1310 may be coupled to gate 1303 by a plug 1308. Plugs 1306,1307, and 1308 may be of an electrically conductive material such as tungsten, for example. Plugs 1306, 1307, and 1308 are in vias formed through a dielectric layer 1403, which may be a layer of silicon dioxide.

Still referring to FIG. 14B, gate 1303 may comprise a dielectric 1311 of silicon nitride and a gate material 1312 of polysilicon. Below gate material 1312 may be a thin oxide layer (not shown). Spacers 407 may also be formed on the sidewalls of gate 1303. Spacers 407 may be of silicon nitride, for example. The length of gate 1303 is depicted in FIG. 13 as dimension D1362.

Comparing dashed areas 1405 of FIG. 14B with dashed areas 605 of FIG. 6B, note that buried-channel region 1105 does not directly abut an edge of a trench 802 along the length of active region 702. This helps minimize parasitic transistor behavior in dashed areas 1405, thereby reducing isolation edge leakage current.

As can be appreciated by those of ordinary skill in the art reading the present disclosure, the just described technique for fabricating a buried-channel transistor with reduced isolation edge leakage current may be employed to fabricate different types of devices with buried-channel transistors. For example, a buried-channel transistor that only receives the first buried-channel implant step will have a relatively high threshold voltage and will still exhibit inverse narrow-width effects, while another buried-channel, relatively narrow transistor in the same device may receive both the first and second buried-channel implants to have a relatively low threshold voltage and reduced isolation edge leakage current. This approach provides more flexibility to the circuit designer as she can selectively choose transistors that need the low leakage current. As another example, a single buried-channel implant that is blocked from isolation edges (using a mask 1214 of FIG. 12, for example) may be used to fabricate all buried-channel transistors in a device. This will allow all relatively narrow buried-channel transistors in the device to have reduced isolation edge leakage current.

Four different types of PMOS transistors were fabricated in one experiment. The characteristics of each type of PMOS transistor employed in the experiment are listed in Table 1.

TABLE 1

| | Blocked Isolation Edge | Width/Length ($\mu$m) |
| --- | --- | --- |
| Type-1 | NO | 25/0.4 |
| Type-2 | YES | 25/0.4 |
| Type-3 | NO | 4/0.4 |
| Type-4 | YES | 4/0.4 |

All of the PMOS transistors in the experiment received a two-step buried-channel implant. In Table 1, the "Blocked Isolation Edge" column indicates whether the PMOS transistor received a second buried-channel implant (i.e., BCI-2) where the isolation edge is blocked (e.g., see FIG. 11B). As shown in Table 1, Type-1 and Type-3 PMOS transistors did not receive a second buried-channel implant where the isolation edge is blocked. The Type-2 and Type-4 PMOS transistors received a second buried-channel implant with blocked isolation edge. For the Type-2 and Type-4 PMOS transistors, the distance between an edge of an opening of the blocking implant mask and an edge of the isolation trench (e.g., see dimension D1202 of FIG. 12) is about 0.28 $\mu$m.

The "width/length" column shows the width of the active region of the PMOS transistor (e.g., see dimension D704 of FIG. 13) and the length of its gate (e.g., see dimension D1362 of FIG. 13). For example, a Type-1 PMOS transistor did not receive a buried-channel implant with blocked isolation edge, has an active region width of 25 $\mu$m, and has a gate length of 0.4 $\mu$m. The Type-1 and Type-2 PMOS transistors represent wide transistors, while the Type-3 and Type-4 PMOS transistors represent narrow transistors.

Figure 15:
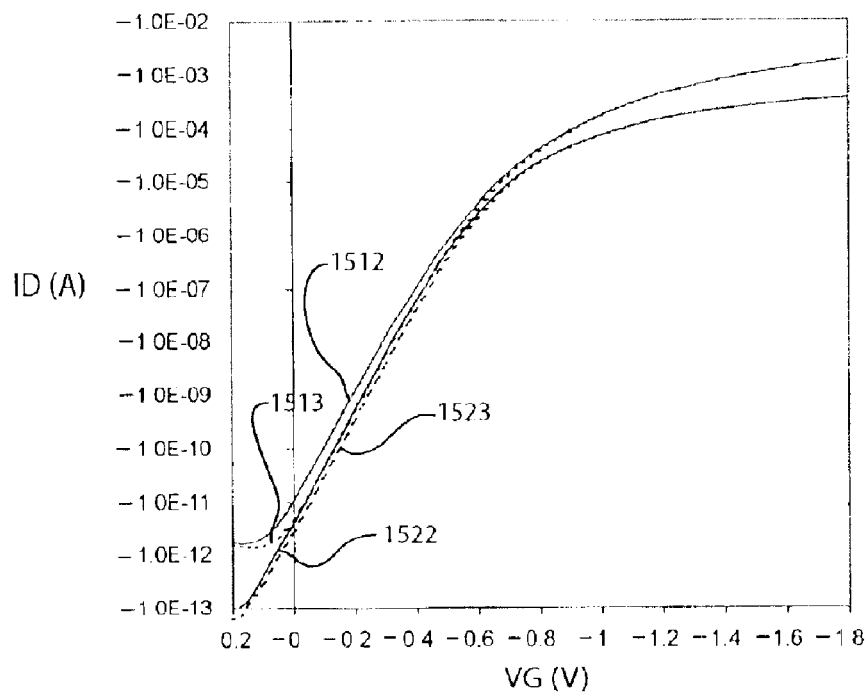
FIGS. 15 and 16 show plots of experimental results.

FIG. 15 shows plots of experimental results for the Type-1 and Type-2 PMOS transistors. In FIG. 15, the horizontal axis represents gate voltage in volts, while the vertical axis represents drain current in amps. The results of FIG. 15 were obtained using the source as a voltage potential reference. Also in FIG. 15:

(a) plot 1512 is for a Type-1 PMOS transistor with a drain voltage of −1.95 volts;

(b) plot 1513 is for a Type-2 PMOS transistor with a drain voltage of −1.95 volts;

(c) plot 1522 is for a Type-1 PMOS transistor with a drain voltage of −0.1 volt; and (d) plot 1523 is for a Type-2 PMOS transistor with a drain voltage of −0.1 volt.

Comparing plot 1512 to plot 1513 and plot 1522 to plot 1523, blocking the isolation edge for the buried-channel implant results in reduced leakage current (see the resulting drain current) even for relatively wide transistors. This result holds true even as the magnitude of the drain voltage is decreased from 1.95 volts to 0.1 volts.

Figure 16:
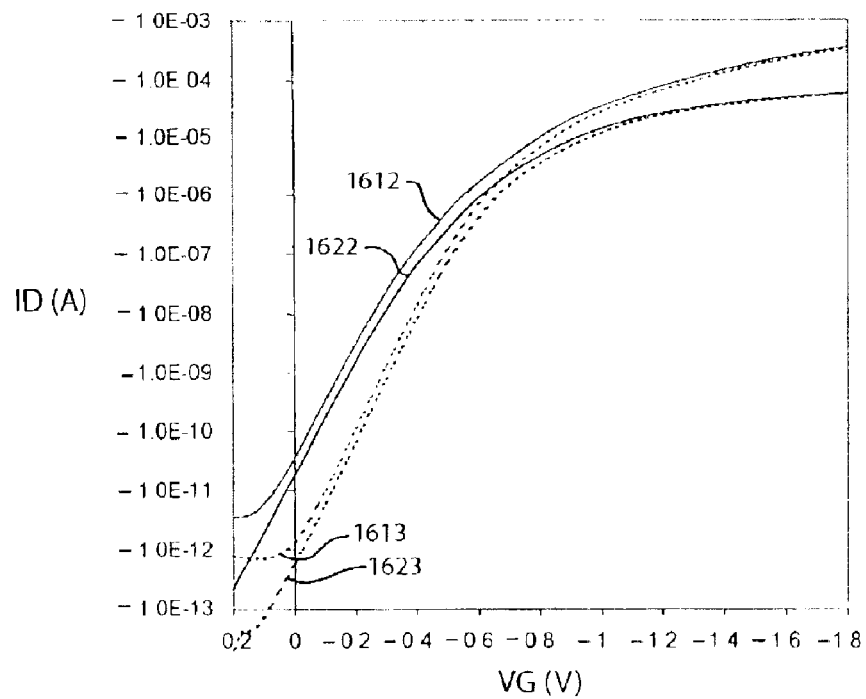

FIG. 16 shows plots of experimental results for the Type-3 and Type-4 PMOS transistors. In FIG. 16, the horizontal axis represents gate voltage in volts, while the vertical axis represents drain current in amps. The results of FIG. 16 were obtained using the source as a voltage potential reference. Also in FIG. 16:

(a) plot 1612 is for a Type-3 PMOS transistor with a drain voltage of −1.95 volts;

(b) plot 1613 is for a Type-4 PMOS transistor with a drain voltage of −1.95 volts;

(c) plot 1622 is for a Type-3 PMOS transistor with a drain voltage of −0.1 volt; and (d) plot 1623 is for a Type-4 PMOS transistor with a drain voltage of −0.1 volt.

Comparing plot 1612 to plot 1613 and plot 1622 to plot 1623, blocking the isolation edge for the buried-channel implant results in reduced leakage current (see the resulting drain current) even more so for relatively narrow transistors than for relatively wide transistors. This result holds true even as the magnitude of the drain voltage is decreased from 1.95 volts to 0.1 volts.

Table 2 below summarizes the leakage current ($I_{OFF}$) at $V_{GS}$=0 V (i.e., gate-source voltage of zero volt) and $V_{DS}$=−1.95 V (i.e., drain-source voltage of −1.95 volts), and saturation current ($I_{DSAT}$) at $V_{GS}=V_{DS}$=−1.8 V for the four types of PMOS transistors evaluated in the experiment. As shown in Table 2, performing a buried-channel implant with blocked isolation edge results in reduced leakage current even for relatively wide transistors. For relatively narrow transistors, blocking the isolation edge for the buried-channel implant may result in significant reduction in leakage current.

TABLE 2

| | Blocked Isolation Edge | $I_{OFF}$ (pA/µm) | $I_{DSAT}$ (µA/µm) |
|---|---|---|---|
| Type-1 (wide) | No | −0.43 | −73.3 |
| Type-2 (wide) | Yes | −0.19 | −73.8 |
| Type-3 (narrow) | No | −9.05 | −82.0 |
| Type-4 (narrow) | Yes | −0.35 | −74.9 |

While specific embodiments of the present invention have been provided, it is to be understood that these embodiments are for illustration purposes and not limiting. Many additional embodiments will be apparent to persons of ordinary skill in the art reading this disclosure. For example, for any of the implant steps described above, a single implant may be replaced by a sequence of implants using various species, energies, and doses to optimize the resulting implant profile. The sequence of masking and implant steps may also be varied. Thus, the present invention is limited only by the following claims.

What is claimed is:

1. A method of fabricating a buried-channel transistor, the method comprising:
   performing a first buried-channel implant in an active region of a transistor using a first mask;
   covering a portion of the active region of the transistor adjacent to a trench along a length of the transistor with a second mask; and
   performing a second buried-channel implant in an exposed portion of the active region using the second mask to adjust a threshold voltage of the transistor, the first and second buried-channel implants being of a same dopant type.

2. The method of claim 1 wherein the transistor comprises a buried-channel PMOS transistor.

3. The method of claim 1 further comprising:
   prior to performing the second buried-channel implant, implanting a dopant in the active region using the first mask to form an N-well.

4. The method of claim 3 wherein the N-well is about 0.5 µm to 2 µm deep.

5. The method of claim 1 wherein the second buried-channel implant forms a buried channel that is about 0.02 µm to 0.10 µm deep into a substrate.

6. The method of claim 1 wherein the first buried-channel implant implants a P-type dopant in a substrate.

7. The method of claim 1 wherein the second mask comprises a photoresist.

8. The method of claim 1 further comprising:
   prior to performing the second buried-channel implant, implanting a dopant in the active region using the first mask to prevent channel punchthrough.

9. The method of claim 1 wherein the trench comprises a shallow trench isolation structure.

10. A method of fabricating a trench-isolated, buried-channel PMOS transistor, the method comprising:
    forming an N-well in an active region;
    performing a first buried-channel implant in the active region using a P-type dopant with a first mask;
    covering a portion along a length of the active region adjacent to an edge of an isolation trench with a second mask; and
    performing a second-buried channel implant using a P-type dopant using the second mask in an exposed portion of the active region to adjust a threshold voltage of the transistor.

11. The method of claim 10 wherein the second mask comprises a photoresist mask.

12. The method of claim 10 further comprising:
    prior to performing the second buried-channel implant, implanting an N-type dopant in the active region using the first mask to prevent channel punchthrough.

13. The method of claim 1 wherein the first and second buried-channel implants provide a doping profile having a substantially same depth into a substrate.

14. The method of claim 10 wherein the first and second buried-channel implants provide a doping profile having a substantially same depth into a substrate.

* * * * *